United States Patent
Moore et al.

(10) Patent No.: US 9,530,022 B1
(45) Date of Patent: Dec. 27, 2016

(54) PROTECTION OF DESIGNS FOR ELECTRONIC SYSTEMS

(71) Applicant: Xilinx, Inc., San Jose, CA (US)

(72) Inventors: Jason J. Moore, Albuquerque, NM (US); James B. Anderson, Albuquerque, NM (US); James D. Wesselkamper, Albuquerque, NM (US); Stephen M. Trimberger, Incline Village, NV (US)

(73) Assignee: XILINX, INC., San Jose, CA (US)

( * ) Notice: Subject to any disclaimer, the term of this patent is extended or adjusted under 35 U.S.C. 154(b) by 158 days.

(21) Appl. No.: 14/502,996

(22) Filed: Sep. 30, 2014

(51) Int. Cl.
*G06F 21/44* (2013.01)
*G06F 21/62* (2013.01)
*G06F 9/445* (2006.01)

(52) U.S. Cl.
CPC .............. *G06F 21/6218* (2013.01); *G06F 8/61* (2013.01)

(58) Field of Classification Search
CPC ........... G06F 21/50; G06F 21/44; G06F 21/60
See application file for complete search history.

(56) References Cited

U.S. PATENT DOCUMENTS

2010/0125739 A1\* 5/2010 Creary ................ H04L 9/0822
713/189

OTHER PUBLICATIONS

Edwards, Chris, "Researchers Probe Security Through Obscurity", Communications of the ACM, vol. 57, No. 8, Aug. 2014, pp. 11-13.

\* cited by examiner

*Primary Examiner* — Izunna Okeke
(74) *Attorney, Agent, or Firm* — LeRoy D. Maunu

(57) ABSTRACT

In one approach for protecting a design, a plurality of implementations of the design are generated. Each implementation includes an identification function. One of the implementations is selected as a current implementation, and the current implementation is installed on one or more electronic systems. For each electronic system, a method determines whether or not the current implementation is an authorized version on the electronic system from an output value of the identification function. If in the current implementation is not an authorized version on the electronic system, a signal is output indicating that the current implementation is not an authorized version on the electronic system. Periodically, another one of the implementations is selected as a new current implementation, and the new current installation is used for installations on one or more electronic systems.

20 Claims, 5 Drawing Sheets

PROTECTION OF DESIGNS FOR ELECTRONIC SYSTEMS

FIELD OF THE INVENTION

The disclosure generally relates to approaches for protecting design information for designs targeted for deployment on electronic systems.

BACKGROUND

Many companies use contract manufacturers (CMs) to produce products. A CM uses a company's design information to make products that the company may sell under its name. For electronic systems, the design information may include proprietary information, such as configuration data, of the company. For example, the configuration data may be a configuration bitstream for field programmable gate array (FPGA) logic that is embedded in the product or program code to be executed by a processor that is embedded in the product.

In order to protect against unauthorized use of the configuration data, encryption techniques have been used to hide the design information embodied in the configuration data. The company providing the configuration data may encrypt the configuration data, and the encrypted configuration data is downloaded to a target device. The target device then decrypts the configuration data for configuring the programmable logic or executing program code. In order to protect the design information in the encrypted configuration data, the key used by the device to decrypt the configuration data may also be encrypted. That is, a "black key," which is an encrypted key, is downloaded to the device. When the device needs to decrypt the configuration data, it first decrypts the black key, and uses the decrypted key to decrypt the configuration data.

Use of a black key may still leave the company vulnerable to unauthorized use of the design information in the encrypted configuration data. For example, a dishonest contract manufacturer might obtain the key used to encrypt the black key, decrypt the black key, and then decrypt the encrypted configuration data.

To protect against a dishonest CM obtaining the key for decrypting the black key, a Diffie-Hellman key exchange (DHKE) function may be used. The DHKE function is downloaded to the target device, and the target device and a configuration controller use the DHKE function to securely provide a key from the configuration controller to the target device. However, the DHKE approach may allow an adversary to reverse engineer the DHKE function on the target device, modify the key exchange function to emit the key, and then load the modified key exchange function on the target device. The modified key exchange function on the target device may then reveal the key to the adversary.

SUMMARY

According to a method of protecting a design, a plurality of implementations of the design are generated and each implementation includes an identification function. One of the plurality of implementations is selected as a current implementation, and the current implementation is installed on one or more electronic systems. For each electronic system of the one or more electronic systems, the method determines whether or not the current implementation is an authorized version on the electronic system from an output value of the identification function. The method outputs a signal indicating that the current implementation is not an authorized version on the electronic system in response to determining that the current implementation is not an authorized version on the electronic system. One of the plurality of implementations other than the current implementation is periodically selected as a new current implementation, and the method repeats the installing, determining, outputting, and periodically selecting using the new current implementation as the current implementation.

A system for configuring target electronic systems is provided in another embodiment. The system includes a storage arrangement that is configured with a plurality of implementations of a design. Each implementation includes an identification function. A configuration controller is coupled to the storage arrangement and is configured to operate as a trusted agent for configuring the target electronic systems. The configuration controller is configured to perform operations including selecting one of the plurality of implementations as a current implementation. The configuration controller installs the current implementation of the design on one or more electronic systems. For each electronic system of the one or more electronic systems, the configuration controller determines whether or not the current implementation is an authorized version on the electronic system from an output value of the identification function. In response to determining that the current implementation is not an authorized version on the electronic system, the configuration controller outputs a signal indicating that the current implementation is not an authorized version on the electronic system. The configuration controller periodically selects one of the plurality of implementations other than the current implementation as a new current implementation and repeats the installing, determining, outputting, and periodically selecting using the new current implementation as the current implementation.

Other features will be recognized from consideration of the Detailed Description and Claims, which follow.

BRIEF DESCRIPTION OF THE DRAWINGS

Various aspects and features of the method and system will become apparent upon review of the following detailed description and upon reference to the drawings in which.

DETAILED DESCRIPTION OF THE DRAWINGS

Figure 1:
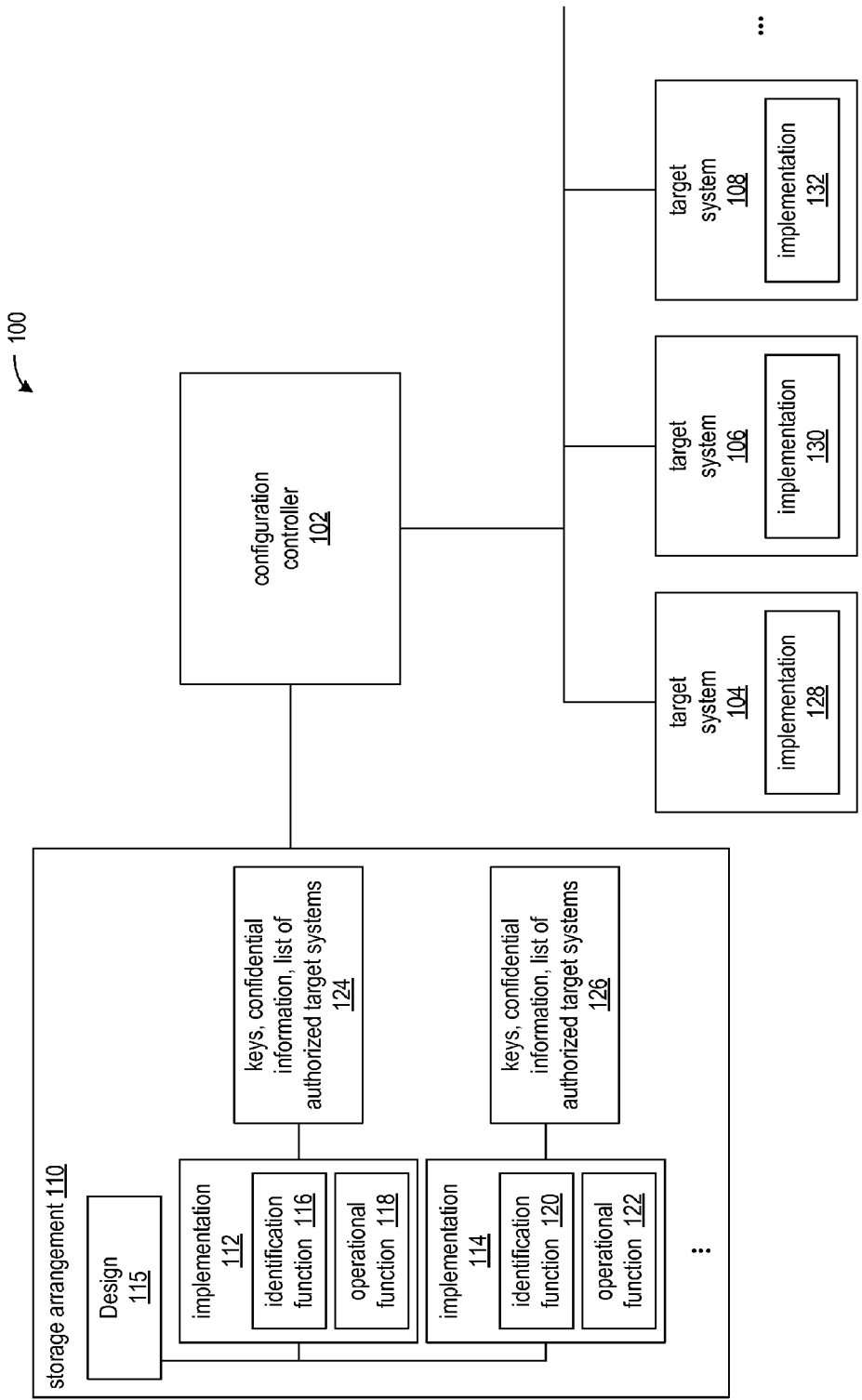
FIG. 1 is a block diagram of a system for controlling configuration of electronic systems.

In the following description, numerous specific details are set forth to describe specific examples presented herein. It should be apparent, however, to one skilled in the art, that one or more other examples and/or variations of these examples may be practiced without all the specific details given below. In other instances, well known features have not been described in detail so as not to obscure the description of the examples herein. For ease of illustration, the same reference numerals may be used in different diagrams to refer to the same elements or additional instances of the same element.

The disclosed approaches protect against reverse engineering of an implementation of a design and discovery of confidential information output by the implemented design. In an example of an application of the disclosed approaches, an implementation of the design executes on a target device and downloads confidential information, for example, a cryptographic key, from a trusted source. The implementation of the design may be executed on a single target device or on multiple target devices to establish the confidential information on the device(s). The downloaded confidential information may be different from one device to another. A "design" is a high-level representation or specification of functions that may be performed by an "implementation" of the design when the implementation is installed on a target system. Designs are typically processed such as through compilation, synthesis, placing-and-routing, etc., to create implementations.

Protection against reverse engineering of an implementation of a design and protection against discovery of confidential information is achieved by creating multiple implementations of the design and embedding different secrets in the implementations. Each implementation has a different embedded secret, and each implementation is used only a limited number of times on a limited number of target devices. Knowledge of the secret enables downloading of the confidential information to the target device.

Frequently changing from one implementation to another reduces the time an attacker has to reverse engineer using the same implementation, thereby reducing the chances of successfully reverse engineering the implementation and learning the secret of the implementation. In addition, even if an implementation is successfully reverse engineered and the secret learned from that implementation, when another implementation is selected and subsequently installed, the previously learned secret will not be the secret in the implementation of the new installation, thusly making knowledge of the old secret useless for subsequent installations.

In one approach, a method of protecting a design includes generating multiple implementations of the design. Each implementation includes an identification function, which is able to derive the secret of the implementation. One of the implementations is selected as a current implementation, and the current implementation of the design is installed on one or more electronic systems. The installations may be performed in parallel or serially. After installing an implementation on an electronic system, the identification function generates an output value based on the secret embedded in the implementation, and the method determines whether or not the current implementation is an authorized version on the electronic system based on the output value from the identification function. An output signal may be output in response to determining that the current implementation is not an authorized version on the electronic system. One of the implementations other than the current implementation is periodically selected as a new current implementation, and the process is repeated with the new current implementation.

In a system made in accordance with the disclosed teachings, a storage arrangement is configured with multiple implementations of the design. Each implementation includes an identification function. A configuration controller is coupled to the storage arrangement and operates as a trusted agent for configuring target electronic systems. The configuration controller may be a stand-alone integrated system or the storage arrangement may be implemented on a computer server and the configuration controller coupled to the computer server over the Internet, for example. The configuration controller is configured to select one of the implementations as a current implementation, and install the current implementation on one or more electronic systems. The installations may be performed in parallel or serially. After installing an implementation on an electronic system, the configuration controller determines whether or not the implementation is authorized based on the output value generated by the identification function. The output value is based on the secret embedded in the implementation. The configuration controller may output a signal in response to determining that the current implementation is not an authorized version on the electronic system. One of the implementations other than the current implementation is periodically selected by the configuration controller as a new current implementation, and the configuration controller repeats the installation and verification with the new current implementation.

FIG. 1 is a block diagram of a system 100 for controlling configuration of electronic systems. Blocks 104, 106, and 108 represent a subset of the target electronic systems to be configured. The target electronic systems may include field programmable gate arrays (FPGAs), complex programmable logic devices, processor-based systems having one or more general purpose processors, application specific processors, graphics processing units, RISC processors, or systems on a chip (SOCs) having programmable or fixed logic and combinations of programmable logic and one or more processors of the same or of different types.

The configuration process involves, in part, downloading implementations from a storage arrangement 110 to the target systems 104, 106, and 108. The storage arrangement may be maintained by a computer server and made accessible to the configuration controller 102 via a network such as the Internet. Secure file transport protocols may be used to transfer the implementations from the storage arrangement to the configuration controller. Alternatively, the storage arrangement 110 and configuration controller may be a stand-alone system computer system having hardware and software suitable for interfacing with the particular target systems.

Implementations 112 and 114 are examples of the implementations stored in the storage arrangement 110. Each of the implementation is an implementation of design 115, and a different secret is embedded in each of the implementations. That is, the secret embedded in implementation 112 is different from the secret embedded in implementation 114. Each of the implementations includes an identification function and an operational function. For example, implementation 112 includes identification function 116 and operational function 118, and implementation 114 includes identification function 120 and operational function 122. Each identification function derives the secret embedded in the respective implementation of which the identification function is a part, and the configuration controller 102 in conjunction with the identification function, verifies whether or not the implementation has been provided without modification and that the implementation has been downloaded to a target system authorized to receive the implementation. Each operational function interacts with the configuration controller for downloading confidential information to the target system on which the implementation is installed.

Along with the implementations such as implementations 112 and 114, the storage arrangement 110 is configured with information associated with the implementations. The associated information may include keys, confidential information, and a list of target systems on which the implementation is authorized to be installed. Blocks 124 and 126 represent the sets of information associated with implementations 112 and 114, respectively.

For each of the target systems 104, 106, 108, etc. to be configured, the configuration controller 102 selects one of the implementations 112, 114, etc. to install on the target system. Depending on security risks and requirements, the configuration controller may limit the installation of each implementation to only one of the target systems. For example, implementations 128, 130, and 132 may be unique relative to one another. Alternatively, the configuration controller may limit the installation of each implementation to some threshold number of target systems greater than one. For example, implementations 128, 130, and 132 may be identical. Multiple target systems may have the same or different implementations installed in parallel by the configuration controller. For example, implementations 128, 130, and 132 may be installed concurrently by the configuration controller. Alternatively, the configuration controller may install the implementations on the target systems serially. For example, implementation 128 may be installed first, implementation 130 may be installed after installation of implementation 128 is complete, and implementation 132 may be installed after installation of implementation 130 is complete.

In the process of configuring the target systems 104, 106, 108, etc., the configuration controller 102 selects one of the implementations 112, 114, etc., for installation on one or more of the target systems. The selection may be arbitrary. The configuration controller reads the selected implementation from the storage arrangement 110 and installs the implementation on one or more of the target systems. Once installed on a target system, the identification function of the implementation generates an output value based on the secret embedded in the implementation. The output value may also be based in part on the physical attributes of the target system such as a physically unclonable function (PUF). The configuration controller determines whether or not the output value from the identification function matches the value associated with the implementation from the storage arrangement 110. For example, the list of authorized target systems in the associated information 124, 126, etc., may include the expected value for the implementation. If the output value matches the expected value, the implementation is authorized for the target system, and further configuration of the target system, such as downloading confidential information to the target system by the operational function, may continue. Otherwise, the configuration controller may cease further configuration of the target system and output a signal indicating the selected implementation is not authorized to be installed on the target system.

The configuration controller periodically selects another one of the implementations 112, 114, etc. to use for installing on one or more target systems 104, 106, 108, etc. For example, after using implementation 112 for a threshold period of time or after having installed the implementation on a threshold number of target systems, the configuration controller selects another one of the implementations, such as implementation 114. The selected implementation is then used for subsequently configuring one or more additional target systems.

Figure 2:
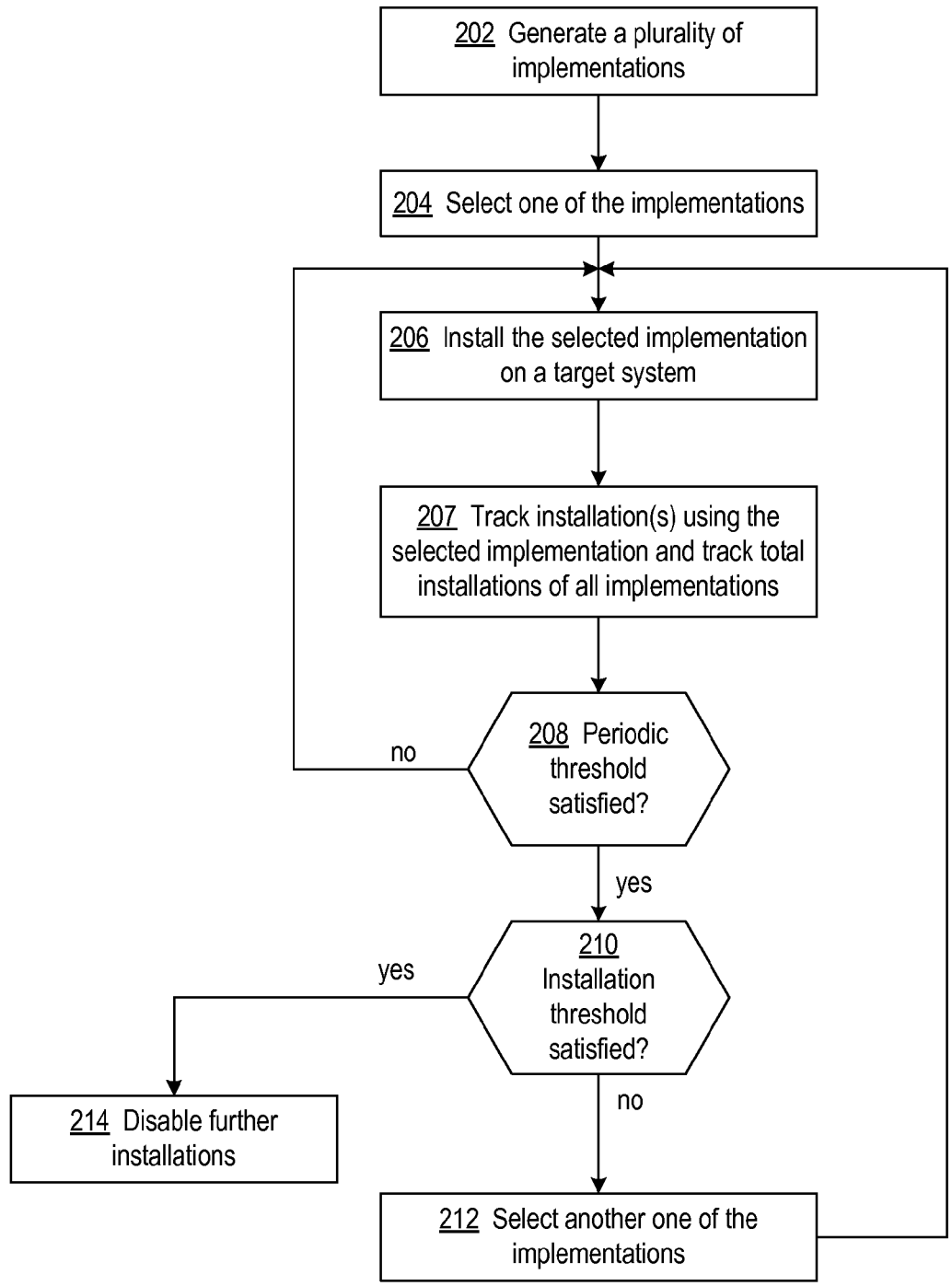
FIG. 2 is a flowchart of a process for controlling configuration of electronic systems using different implementations of a design.

FIG. 2 is a flowchart of a process for controlling configuration of electronic systems using different implementations of a design. At block 202, the process generates multiple, different implementations of the same design. Each implementation includes an identification function and an operational function. The identification function in each implementation generates an output value based in whole or in part on a unique secret of the implementation. Each operational function interfaces with the configuration controller for transferring confidential information to a target system if the implementation is authorized on that system.

The secrets embedded in the implementations and the associated identification functions of the implementations may be generated in a variety of ways. The approaches described below may be employed individually or in combination with one or more others of the approaches. In one approach to embedding secrets in the different implementations, the placement and routing of the implementations may be randomized. For example, different placements and routing for the implementations may be randomly generated such as by selecting a subset of the components of the implementation and assigning random placements to those components. Some subset of routes between components may also be randomly assigned to routing resources of the target system. The identification function determines an output value based on the random placement and/or random routing such as by computing a hash function on the implementation or by generating the output value based on the delays of signals affected by the random placement and/or routing.

In another approach, a portion of the synthesized logic for the implementation may be changed from one implementation to another. For example, different identification functions may be generated for the different implementations. Each identification function may include a large network resulting from applying an XOR function with a random key that is different for each implementation. The identification function determines the output value based on the implementation having the randomized network such as by computing a hash function on the implementation or by generating the output value based on the delays of signals affected by the randomized network.

A state machine may be encoded in a different manner in each of the implementations in another approach. For example, a state machine may have a very large state register having on the order of hundreds of bits. The value in the state register may represent one state in one implementation and another state in another implementation. The identification function determines the output value based on the state machine encoding in the current implementation such as by computing a hash function on the implementation or by generating the output value based on the delays of signals affected by the state machine encoding.

In another approach, different sets of dummy delay states may be added to a state machine in the implementations. Each implementation has a different set of dummy delay states. The identification function determines the output value based on the dummy delay states in the current implementation such as by computing a hash function on the implementation or by generating the output value based on the delays of signals affected by the dummy delay states in the state machine.

The addresses of data in a memory used by the implementation and the addressing of the data in the memory may be varied from one implementation to another according to another approach. That is, a data element may be stored in one address in one implementation, and the same data element may be stored at a different address in another implementation. The identification function determines the output value based on the addressing of the data in the current implementation such as by computing a hash function on the implementation.

According to another approach, respective sets of functions may be implemented as lookup table functions in the implementations. Each implementation has a different set of one or more functions implemented as a lookup table, with each lookup table implemented in a RAM, for example. The identification function determines the output value based on the functions implemented by lookup tables in the current implementation such as by computing a hash function on the implementation.

Race conditions may be used to embed secrets in the implementations in another approach. For example, each implementation may be specified to capture values of a respective set of one or more signals before those signals reach steady states. The respective set of signals is different for each implementation. The identification function determines the output value based on the captured values of the unsettled signals in the current implementation such as by computing a hash function on the implementation or by generating the output value based on the delays of signals affected by unsettled signals.

In another approach, partial reconfiguration of programmable logic in a target system may be used to embed different secrets in the implementations. Not all of an implementation needs to be initially installed in the programmable logic. Partial reconfiguration can be used to add additional functionality to the programmable logic. After installing an initial portion of the implementation, a partial reconfiguration portion of the implementation may be separately transmitted from the secure storage arrangement and possibly obscured with commands in the partial reconfiguration portion or by having been XORed with a hash of the initial portion of the implementation. The partial reconfiguration portion may be alternatively transmitted along with the initial portion, stored in RAM on the target system, and subsequently retrieved from the RAM and used to reconfigure a portion of the programmable logic. Partial reconfiguration would make a-priori reverse-engineering nearly impossible. The adversary would need to reverse-engineer the partial reconfiguration logic, then determine the actual final implementation, and then reverse-engineer the final implementation. The partial reconfiguration may overwrite some portion of the initial portion, so an adversary would not immediately see that partial reconfiguration is occurring.

Each implementation may be specified to perform partial reconfiguration of a portion of the implementation. Each implementation may be configured to partially reconfigure a different portion of the implementation. The identification function determines the output value based on the partial reconfiguration hidden in the current implementation such as by computing a hash function on the implementation either before or after partial reconfiguration is complete.

At block 204, one of the implementations is selected by the configuration controller, for example, for installation on one or more target systems. The selected implementation is installed on a target system at block 206. The installation of the implementation and further configuration of the target system, including actions of the identification function and operational functions of the implementation, are further shown in FIG. 3.

For purposes of periodically selecting a new implementation to use in a subsequent installation(s), at block 207, the configuration controller tracks the installations of the current implementation by time or by number of target systems on which the implementation has been installed. The configuration controller also tracks the total number of target systems on which all implementations have been installed. For example, a manufacturer may be authorized to build only a certain number of systems and install the implementations on that number of systems.

Decision block 208 tests whether or not a periodic threshold has been satisfied for use of the current implementation. For example, if the current implementation has been used for installations for a certain period of time, the periodic threshold is satisfied. Alternatively, if the current implementation has been installed on a threshold number of target systems, the periodic threshold is satisfied. If the periodic threshold has not yet been satisfied, the process returns to block 206, and installation of the current implementation on one or more target systems continues.

If the periodic threshold is satisfied, the configuration controller determines at decision block 210 whether or not an installation threshold is satisfied. The installation threshold may be used to control the total number of target systems on which the alternative implementations are installed. If the installation threshold is not satisfied, another one of the implementations is selected at block 212. The implementation may be selected at random from a set of implementations that had been previously generated, for example. Once the periodic threshold has been reached for an implementation, that implementation may be removed from the set of implementations available for selection. The process then returns to block 206 and repeats installations of the newly selected implementation on one or more target systems. If the installation threshold has been satisfied, decision block 210 directs the process to block 214, where the configuration controller disables further installations of implementations on any target systems.

Figure 3:
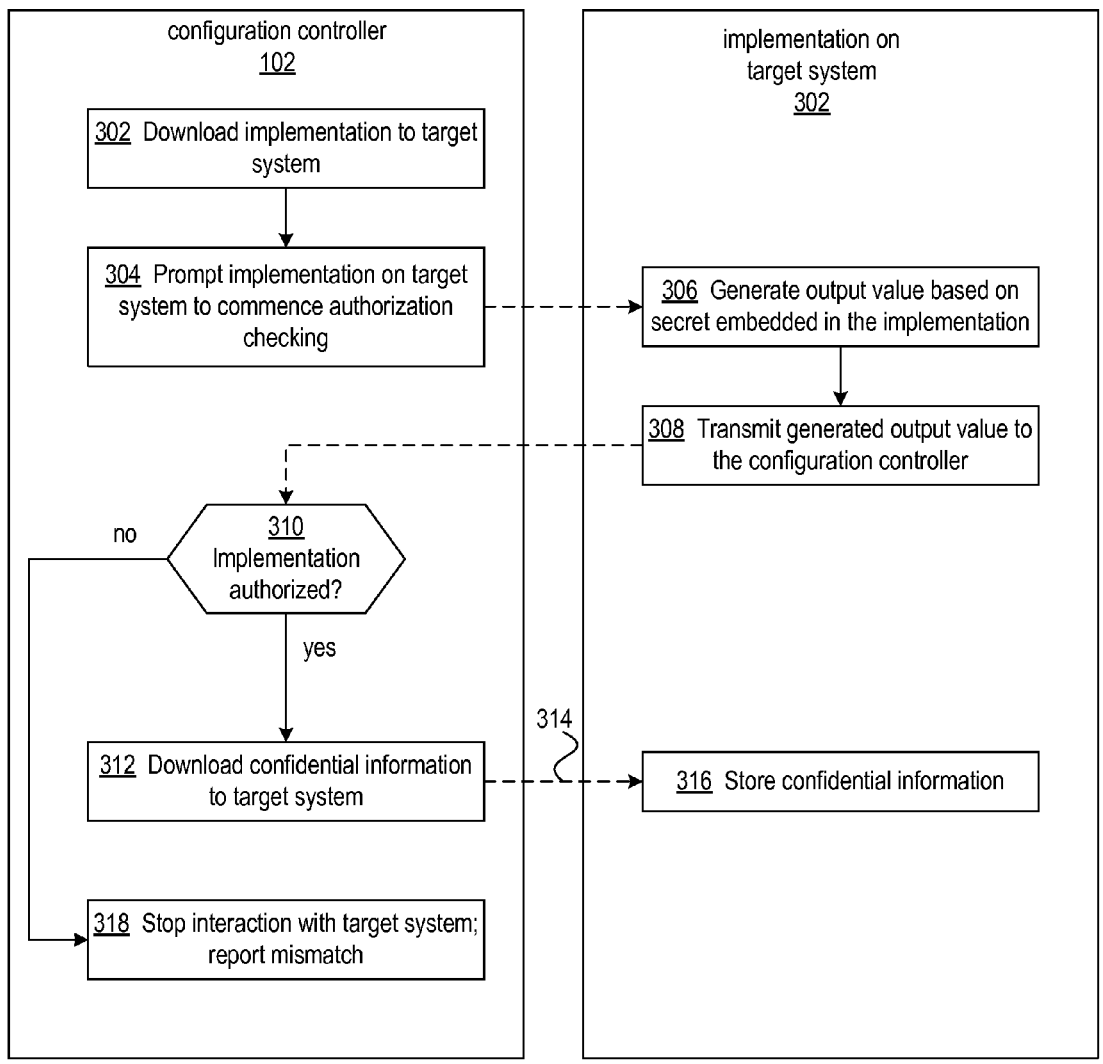
FIG. 3 is a flowchart of a process showing installation of an implementation on a target electronic system.

FIG. 3 is a flowchart of a process showing installation of an implementation on a target electronic system 301. The process of FIG. 3 is an example of actions performed in support of the process block 206 of FIG. 2. At block 302, the configuration controller 102 downloads an implementation to a target system.

Blocks 304, 306, 308, and 310 show the configuration controller interfacing with the implementation on the target system 302 for determining whether or not the implementation is authorized on the target system. At block 304, the configuration controller prompts the implementation on the target system to begin authorization. The prompt may be, but is not limited to, a challenge-response approach, for example. The implementation downloaded to the target may authenticate messages from the configuration controller before continuing with generating the output value for the configuration controller. This protects against an adversary attempting to get the target system to respond to forged or replayed messages from the configuration controller.

At block 306, the identification function of the implementation 302 generates an output value based on the secret embedded in the implementation. The output value may be computed as a hash function on the implementation, and optionally a PUF of the target system. The output value may also be determined as a function of one or more delays in the implementation. For example, if different delays are inserted in to a state machine in the different implementations, the identification function may generate an output value based on the delays in the implementation. Delays may be analog delays as a result of different placement, for example.

At block 308, the output value is transmitted to the configuration controller, and at decision block 310 the configuration controller determines whether or not the implementation is authorized based on the output value. The determination may be made based on an expected value associated with the implementation and target system as read from a database of implementations, for example.

If the implementation is authorized, at block 312, the configuration controller downloads confidential information to the target system. The confidential information may be a cryptographic key, for example. The confidential information may be encrypted and transmitted to the implementation 302 on the target system via a secure channel 314. At block 316, the operational function of the implementation on the target system 302 stores the confidential information on the target system. If decision block 310 finds that the implementation is not authorized, the configuration controller bypasses downloading of the confidential information to the target system and stops interaction with the target system at block 318. The configuration controller may also report the mismatch to the user or to the party having an interest in limiting installations of the implementations.

Figure 4:
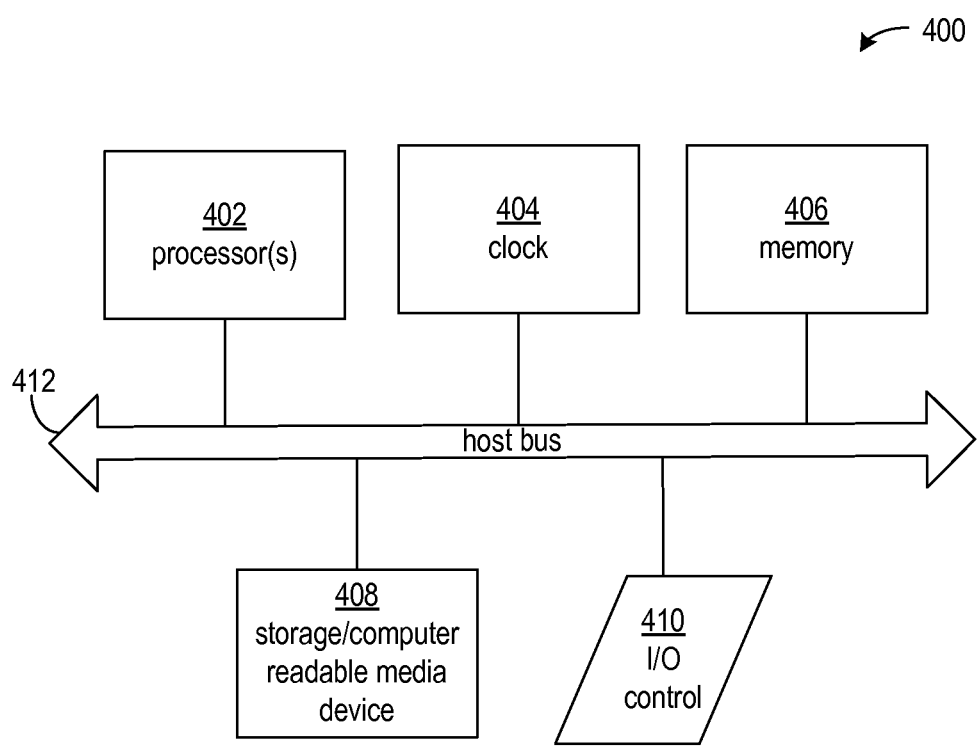
FIG. 4 is a block diagram of a computing arrangement that may be used to implement the configuration controller and/or the storage arrangement.

FIG. 4 is a block diagram of a computing arrangement 400 that may be used to implement the configuration controller 102 and/or the storage arrangement 110. It will be appreciated that various alternative computing arrangements, including one or more processors and a memory arrangement configured with program code, would be suitable for hosting the disclosed processes and data structures. The computer code, which implements the disclosed processes, is encoded in a processor executable format and may be stored and provided via a variety of computer-readable storage media or delivery channels such as magnetic or optical disks or tapes, electronic storage devices, or as application services over a network.

Processor computing arrangement 400 includes one or more processors 402, a clock signal generator 404, a memory arrangement 406, a storage arrangement 408, and an input/output control unit 410, all coupled to a host bus 412. The arrangement 400 may be implemented with separate components on a circuit board or may be implemented internally within an integrated circuit. When implemented internally within an integrated circuit, the processor computing arrangement is otherwise known as a microcontroller.

The architecture of the computing arrangement depends on implementation requirements as would be recognized by those skilled in the art. The processor(s) 402 may be one or more general purpose processors, or a combination of one or more general purpose processors and suitable co-processors, or one or more specialized processors (e.g., RISC, CISC, pipelined, etc.).

The memory arrangement 406 typically includes multiple levels of cache memory, and a main memory. The storage arrangement 408 may include local and/or remote persistent storage, such as provided by magnetic disks (not shown), flash, EPROM, or other non-volatile data storage. The storage unit may be read or read/write capable. Further, the memory arrangement 406 and storage arrangement 408 may be combined in a single arrangement.

The processor(s) 402 executes the software in storage arrangement 408 and/or memory arrangement 406, reads data from and stores data to the storage arrangement 408 and/or memory arrangement 406, and communicates with external devices through the input/output control arrangement 410. These functions are synchronized by the clock signal generator 404. The resource of the computing arrangement may be managed by either an operating system (not shown), or a hardware control unit (not shown).

Figure 5:
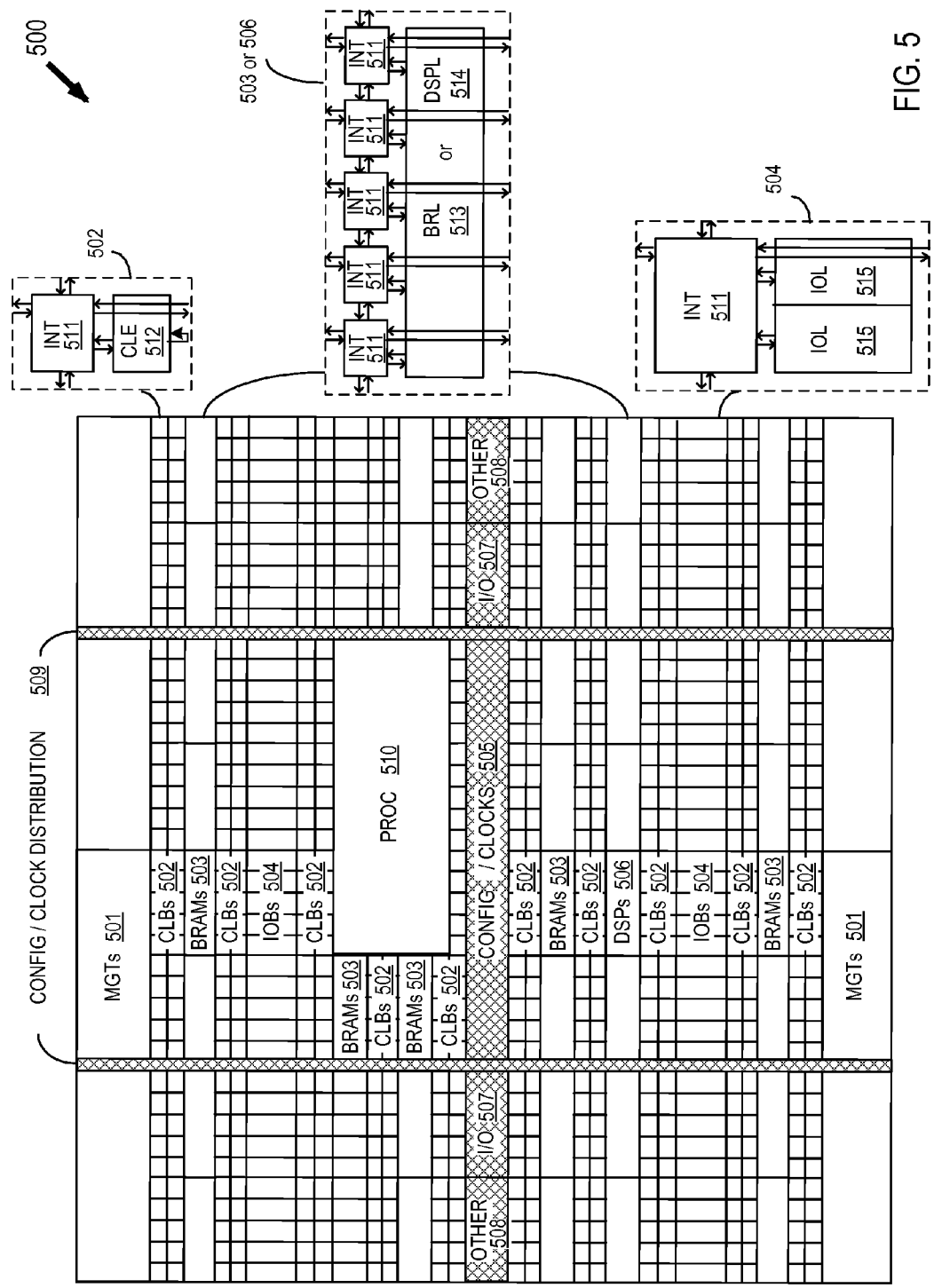
FIG. 5 shows an example of a programmable IC.

FIG. 5 shows an example of a programmable IC. The programmable IC is one type of a target electronic system that may be configured according to the processes described herein. It will be recognized that other types of electronic systems such as general purpose processors, graphics processors, application-specific processors, complex programmable logic devices, programmable analog arrays, etc., may be configured according to the processes described herein.

The programmable IC may also be referred to as a System On Chip (SOC) that includes field programmable gate array logic (FPGA) along with other programmable resources. FPGA logic may include several different types of programmable logic blocks in the array. For example, FIG. 5 illustrates programmable IC 500 that includes a large number of different programmable tiles including multi-gigabit transceivers (MGTs) 501, configurable logic blocks (CLBs) 502, random access memory blocks (BRAMs) 503, input/output blocks (IOBs) 504, configuration and clocking logic (CONFIG/CLOCKS) 505, digital signal processing blocks (DSPs) 506, specialized input/output blocks (I/O) 507, for example, clock ports, and other programmable logic 508 such as digital clock managers, analog-to-digital converters, system monitoring logic, and so forth. Some programmable IC having FPGA logic also include dedicated processor blocks (PROC) 510 and internal and external reconfiguration ports (not shown).

In some FPGA logic, each programmable tile includes a programmable interconnect element (INT) 511 having standardized connections to and from a corresponding interconnect element in each adjacent tile. Therefore, the programmable interconnect elements taken together implement the programmable interconnect structure for the illustrated FPGA logic. The programmable interconnect element INT 511 also includes the connections to and from the programmable logic element within the same tile, as shown by the examples included at the top of FIG. 5.

For example, a CLB 502 can include a configurable logic element CLE 512 that can be programmed to implement user logic, plus a single programmable interconnect element INT 511. A BRAM 503 can include a BRAM logic element (BRL) 513 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 506 can include a DSP logic element (DSPL) 514 in addition to an appropriate number of programmable interconnect elements. An IOB 504 can include, for example, two instances of an input/output logic element (IOL) 515 in addition to one instance of the programmable interconnect element INT 511. As will be clear to those of skill in the art, the actual I/O bond pads connected, for example, to the I/O logic element 515, are manufactured using metal layered above the various illustrated logic blocks, and typically are not confined to the area of the input/output logic element 515.

In the pictured embodiment, a columnar area near the center of the die (shown shaded in FIG. 5) is used for configuration, clock, and other control logic. Horizontal areas 509 extending from this column are used to distribute the clocks and configuration signals across the breadth of the programmable IC. Note that the references to "columnar" and "horizontal" areas are relative to viewing the drawing in a portrait orientation.

Some programmable ICs utilizing the architecture illustrated in FIG. 5 include additional logic blocks that disrupt the regular columnar structure making up a large part of the programmable IC. The additional logic blocks can be programmable blocks and/or dedicated logic. For example, the processor block PROC 510 shown in FIG. 5 spans several columns of CLBs and BRAMs.

Note that FIG. 5 is intended to illustrate only an exemplary programmable IC architecture. The numbers of logic blocks in a column, the relative widths of the columns, the number and order of columns, the types of logic blocks included in the columns, the relative sizes of the logic blocks, and the interconnect/logic implementations included at the top of FIG. 5 are purely exemplary. For example, in an actual programmable IC, more than one adjacent column of CLBs is typically included wherever the CLBs appear, to facilitate the efficient implementation of user logic.

Though aspects and features may in some cases be described in individual figures, it will be appreciated that features from one figure can be combined with features of another figure even though the combination is not explicitly shown or explicitly described as a combination.

The methods and system are thought to be applicable to a variety of systems for establishing confidential information on a target system. Other aspects and features will be apparent to those skilled in the art from consideration of the specification. The methods and system may be implemented as one or more processors configured to execute software, as an application specific integrated circuit (ASIC), or as a logic on a programmable logic device. It is intended that the specification and drawings be considered as examples only, with a true scope of the invention being indicated by the following claims.

What is claimed is:

1. A method of protecting a design, comprising:
   generating a plurality of implementations of the design, wherein each implementation includes a different embedded secret and an identification function;
   selecting one of the plurality of implementations as a current implementation for installation on one or more of a plurality of target electronic systems;
   installing the current implementation of the design on the one or more of the target electronic systems;
   for each electronic system of the one or more of the target electronic systems,
      generating by the identification function an output value based on the embedded secret;
      determining whether or not the current implementation is an authorized version on the electronic system from the output value of the identification function;
      if the current implementation is not an authorized version on the electronic system, outputting a signal indicating that the current implementation is not an authorized version on the electronic system;
   periodically selecting one of the plurality of implementations other than the current implementation as a new current implementation for installation on one or more others of the target electronic systems on which an implementation of the plurality of implementations has not been installed; and
   repeating the installing, determining, outputting, and periodically selecting using the new current implementation as the current implementation on the one or more others of the target electronic systems.

2. The method of claim 1, wherein each implementation further includes an operational function, and the method further comprises:
   downloading, in response to the current implementation being an authorized version on a target electronic system of the one or more target electronic systems, confidential information to the target electronic system and storing the confidential information on the target electronic system by the operational function; and
   bypassing the downloading of the confidential information to the target electronic system in response to the current implementation not being an authorized version on the target electronic system.

3. The method of claim 2, wherein the confidential information is a cryptographic key.

4. The method of claim 2, wherein the confidential information is an encrypted cryptographic key.

5. The method of claim 1, further comprising:
   wherein the generating of the plurality of implementations of the design includes randomly generating different placements and routing for the implementations; and
   wherein the generating the output value includes determining by the identification function the output value as a function of the placement and routing of the current implementation.

6. The method of claim 1, further comprising:
   wherein the generating of the plurality of implementations of the design includes generating different identification functions in the implementations, respectively.

7. The method of claim 1, further comprising:
   wherein the generating of the plurality of implementations of the design includes encoding a state machine differently in the plurality of implementations; and
   wherein the generating the output value includes determining by the identification function the output value as a function of the state machine encoding in the current implementation.

8. The method of claim 1, further comprising:
   wherein the generating of the plurality of implementations of the design includes adding different sets of dummy delay states to a state machine in the plurality of implementations; and
   wherein the generating the output value includes determining by the identification function the output value as a function of the dummy delay states in the state machine of the current implementation.

9. The method of claim 1, further comprising:
   wherein the generating of the plurality of implementations of the design includes changing addresses of data in a memory used by the implementation and changing addressing of the data in the memory by the plurality of implementations; and
   wherein the generating the output value includes determining by the identification function the output value as a function of the addressing of the data by the current implementation.

10. The method of claim 1, further comprising:
    wherein the generating of the plurality of implementations of the design includes generating different respective sets of one or more lookup table functions in the plurality of implementations; and
    wherein the generating the output value includes determining by the identification function the output value as a function of the respective set of one or more lookup table functions in the current implementation.

11. The method of claim 1, further comprising:
    wherein the generating of the plurality of implementations of the design includes specifying in the plurality of implementations, capture of different respective sets of one or more signal values before the one or more signal values reach steady states; and
    wherein the generating the output value includes determining by the identification function the output value as a function of the respective sets of one or more signal values in the current implementation.

12. The method of claim 1, further comprising:
wherein the generating of the plurality of implementations of the design includes specifying in the plurality of implementations, partial reconfiguration of different portions of the implementation, respectively; and
wherein the generating the output value includes determining by the identification function the output value after partial reconfiguration in the current implementation.

13. The method of claim 1, wherein the generating the output value includes determining by the identification function the output value from a hash function on the implementation.

14. The method of claim 1, wherein the generating the output value includes determining by the identification function the output value as a function of attributes of the implementation and physical attributes of the electronic system.

15. The method of claim 1, wherein the periodically selecting includes selecting the one of the plurality of implementations other than the current implementation as the new current implementation after installation of the current implementation on a threshold number of the one or more electronic systems.

16. The method of claim 1, wherein the periodically selecting includes selecting the one of the plurality of implementations other than the current implementation as the new current implementation after installation of the current implementation on the one or more electronic systems for a threshold period of time.

17. The method of claim 1, further comprising:
counting a number of the one or more electronic systems; and
disabling the installing of the current implementation in response to the number of the one or more electronic systems reaching an installation threshold.

18. The method of claim 1, wherein a configuration controller performs the installing of the current implementation on the one or more electronic systems, and the method further includes the current implementation on each of the one or more electronic systems authenticating the configuration controller.

19. A system for configuring a plurality of target electronic systems, comprising:
a storage arrangement, wherein the storage arrangement is configured with a plurality of implementations of a design, wherein each implementation includes a different embedded secret and an identification function, and each identification function is configured to generate an output value based on the embedded secret;
a configuration controller coupled to the storage arrangement, wherein the configuration controller is configured to operate as a trusted agent for configuring the target electronic systems by performing operations including:
selecting one of the plurality of implementations as a current implementation for installation on one or more of the target electronic systems;
installing the current implementation of the design on the one or more of the target electronic systems;
for each electronic system of the one or more electronic systems,
determining whether or not the current implementation is an authorized version on the electronic system from the output value of the identification function;
outputting a signal indicating that the current implementation is not an authorized version on the electronic system in response to determining that the current implementation is not an authorized version on the electronic system;
periodically selecting one of the plurality of implementations other than the current implementation as a new current implementation for installation on one or more others of the target electronic systems on which an implementation of the plurality of implementations has not been installed; and
repeating the installing, determining, outputting, and periodically selecting using the new current implementation as the current implementation on the one or more others of the target electronic systems.

20. The system of claim 19, wherein each implementation further includes an operational function, and the configuration controller is further configured to perform operations including:
downloading, in response to the current implementation being an authorized version on a target electronic system of the one or more target electronic systems, confidential information to the target electronic system; and
bypassing the downloading of the confidential information to the target electronic system in response to the current implementation not being an authorized version on the target electronic system.

* * * * *